(12) United States Patent
Oh et al.

(10) Patent No.: US 9,766,540 B2
(45) Date of Patent: Sep. 19, 2017

(54) METHOD OF FORMING PHOTOMASK

(71) Applicant: SAMSUNG ELECTRONICS CO., LTD., Suwon-si, Gyeonggi-do (KR)

(72) Inventors: Jong Keun Oh, Seoul (KR); Hyungho Ko, Hwaseong-si (KR); Inkyun Shin, Yongin-si (KR); Jaehyuck Choi, Seoul (KR); JunYoul Choi, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 84 days.

(21) Appl. No.: 14/977,767

(22) Filed: Dec. 22, 2015

(65) Prior Publication Data

US 2016/0124301 A1 May 5, 2016

Related U.S. Application Data

(62) Division of application No. 14/059,533, filed on Oct. 22, 2013, now Pat. No. 9,223,199.

(30) Foreign Application Priority Data

Oct. 22, 2012 (KR) .................. 10-2012-0117361

(51) Int. Cl.
| | |
|---|---|
| *G03F 1/76* | (2012.01) |
| *G03F 1/48* | (2012.01) |
| *G03F 1/68* | (2012.01) |
| *G03F 1/80* | (2012.01) |
| *G03F 1/38* | (2012.01) |
| *G03F 1/54* | (2012.01) |

(52) U.S. Cl.
CPC .................. *G03F 1/76* (2013.01); *G03F 1/38* (2013.01); *G03F 1/48* (2013.01); *G03F 1/68* (2013.01); *G03F 1/80* (2013.01); *G03F 1/54* (2013.01)

(58) Field of Classification Search
None
See application file for complete search history.

(56) References Cited

U.S. PATENT DOCUMENTS

| | | | |
|---|---|---|---|
| 5,482,799 A | 1/1996 | Isao et al. | |
| 2005/0009360 A1* | 1/2005 | Sun | ..... H01L 21/3086 438/745 |
| 2008/0261122 A1 | 10/2008 | Gambino et al. | |
| 2012/0148944 A1 | 6/2012 | Oh et al. | |

FOREIGN PATENT DOCUMENTS

| | | |
|---|---|---|
| JP | 07-168343 A | 7/1995 |
| JP | 08-123008 A | 5/1996 |
| JP | 2010-091624 A | 4/2010 |
| KR | 10-2008-0071794 A | 8/2008 |
| KR | 10-2010-0028437 A | 3/2010 |
| KR | 10-2012-0081654 A | 7/2012 |

* cited by examiner

*Primary Examiner* — Stephen Rosasco
(74) *Attorney, Agent, or Firm* — Lee & Morse, P.C.

(57) ABSTRACT

A photomask and a method of forming the same, the photomask including a transparent substrate; a light shielding pattern on the transparent substrate, the light shielding pattern including molybdenum and silicon; and an etch stop layer covering at least a sidewall of the light shielding pattern, wherein the etch stop layer has an etch rate lower than an etch rate of the light shielding pattern with respect to an ammonia-based cleaning solution.

9 Claims, 8 Drawing Sheets

US 9,766,540 B2

METHOD OF FORMING PHOTOMASK

CROSS-REFERENCE TO RELATED APPLICATIONS

This is a divisional application based on pending application Ser. No. 14/059,533, filed Oct. 22, 2013, the entire contents of which is hereby incorporated by reference.

Korean Patent Application No. 10-2012-0117361, filed on Oct. 22, 2012, in the Korean Intellectual Property Office, and entitled: "Photomask and Method of Forming the Same," is incorporated by reference herein in its entirety.

BACKGROUND

1. Field

Embodiments relate to a photomask and a method of forming the same.

2. Description of the Related Art

Fine circuit patterns have been increasingly demanded for high integration of a large-scale integrated circuit in a fabricating process of a semiconductor device.

SUMMARY

Embodiments are directed to a photomask and a method of forming the same.

The embodiments may be realized by providing a photomask including a transparent substrate; a light shielding pattern on the transparent substrate, the light shielding pattern including molybdenum and silicon; and an etch stop layer covering at least a sidewall of the light shielding pattern, wherein the etch stop layer has an etch rate lower than an etch rate of the light shielding pattern with respect to an ammonia-based cleaning solution.

The etch stop layer may include molybdenum, silicon, and nitrogen; and a nitrogen content of the etch stop layer may be higher than a nitrogen content of the light shielding pattern.

The nitrogen content of the etch stop layer may be about 14 at % to about 28 at % of a molybdenum content of the etch stop layer.

The light shielding pattern may include a first surface adjacent to the transparent substrate and a second surface spaced apart from the transparent substrate; the light shielding pattern may further include nitrogen; and a nitrogen concentration of a portion of the light shielding pattern adjacent to the second surface may be higher than a nitrogen concentration of a portion of the light shielding pattern adjacent to the first surface.

The etch stop layer may extend onto the second surface of the light shielding pattern; and a thickness of the etch stop layer on the second surface may be smaller than a thickness of the etch stop layer on a sidewall of the light shielding pattern.

The light shielding pattern may further include oxygen; and an oxygen concentration of the portion of the light shielding pattern adjacent to the second surface may be lower than an oxygen concentration of the portion of the light shielding pattern adjacent to the first surface.

The etch stop layer may have a thickness of about 3 nm or less.

The etch rate of the etch stop layer may be about 10% to about 50% of the etch rate of the light shielding pattern with respect to the ammonia-based cleaning solution.

The light shielding pattern may include a first surface adjacent to the transparent substrate and a second surface spaced apart from the transparent substrate; a nitrogen concentration may be substantially uniform throughout the light shielding pattern; the etch stop layer may extend onto the second surface; and the etch stop layer may have a substantially uniform thickness regardless of a position of the etch stop layer.

The ammonia-based cleaning solution may include at least one of ammonia water (NH$_4$OH) and tetramethylammonium hydroxide (TMAH).

The light shielding pattern may have a light transmittance of substantially 0%.

The embodiments may also be realized by providing a method of forming a photomask, the method including forming a light shielding pattern on a transparent substrate such that the light shielding pattern include molybdenum and silicon; and performing a plasma nitriding process on at least a sidewall of the light shielding pattern to form an etch stop layer.

The plasma nitriding process may be performed using a plasma power of about 1,500 W to about 3,000 W at a temperature of about 25 degrees Celsius to about 300 degrees Celsius under an atmosphere including at least one of a nitrogen gas and an ammonia gas.

Nitrogen ions may permeate into at least the sidewall of the light shielding pattern by the plasma nitriding process Forming the light shielding pattern may include forming a light shielding layer on the transparent substrate; forming a hard mask pattern on the light shielding layer; and patterning the light shielding layer using the hard mask pattern as an etch mask.

The hard mask pattern may contain chromium.

The hard mask pattern may have a thickness of about 10 nm or less.

The light shielding layer may be formed to have a nitrogen concentration gradient according to a height.

The method may further include cleaning the light shielding pattern using an ammonia-based cleaning solution, wherein the etch stop layer has an etch rate lower than an etch rate of the light shielding pattern with respect to the ammonia-based cleaning solution.

The plasma nitriding process may be performed under an oxygen-free atmosphere.

BRIEF DESCRIPTION OF THE DRAWINGS

Features will be apparent to those of skill in the art by describing in detail exemplary embodiments with reference to the attached drawings in which.

Figure 1:
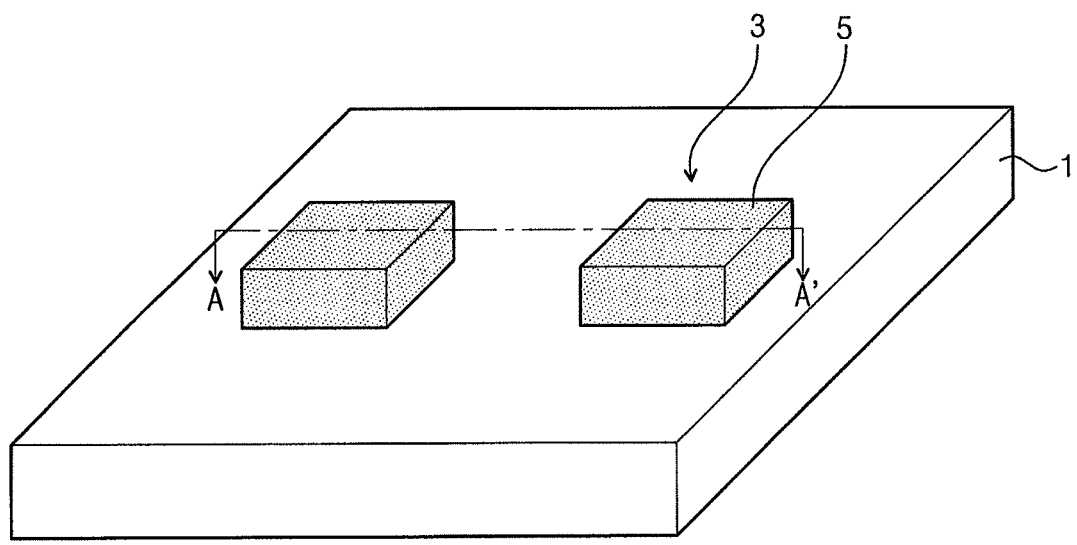
FIG. 1 illustrates a perspective view of a photomask according to example embodiments.

in a lower portion, an upper portion, and a sidewall portion of a light shielding pattern, respectively.

DETAILED DESCRIPTION

The embodiments will now be described more fully hereinafter with reference to the accompanying drawings, in which exemplary embodiments are shown. The advantages and features of the embodiments and methods of achieving them will be apparent from the following exemplary embodiments that will be described in more detail with reference to the accompanying drawings. It should be noted, however, that the embodiments are not limited to the following exemplary embodiments, and may be implemented in various forms. Accordingly, the exemplary embodiments are provided only to disclose the embodiments and let those skilled in the art know the category of the embodiments. In the drawings, embodiments are not limited to the specific examples provided herein and may be exaggerated for clarity.

The terminology used herein is for the purpose of describing particular embodiments only and is not intended to limit the embodiments. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described with sectional views as ideal exemplary views of the embodiments. Accordingly, shapes of the exemplary views may be modified according to manufacturing techniques and/or allowable errors. Therefore, the embodiments are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the embodiments.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the embodiments. Exemplary embodiments of aspects of the embodiments explained and illustrated herein may include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Hereinafter, embodiments will be described in more detail. A photomask according to the embodiments may be a hardmask binary photomask.

Figure 2:
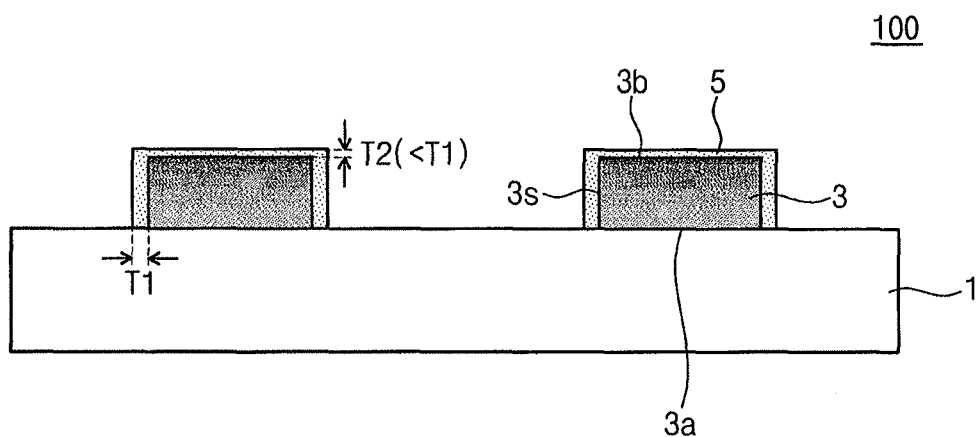
FIG. 2 illustrates a cross-sectional view taken along a line I-I' of FIG. 1 to illustrate a photomask according to a first embodiment.

FIG. 1 illustrates a perspective view of a photomask according to example embodiments. FIG. 2 illustrates a cross-sectional view taken along a line I-I' of FIG. 1 to illustrate a photomask according to a first embodiment.

Referring to FIGS. 1 and 2, a photomask 100 according to the present embodiment may include a transparent substrate 1 and light shielding patterns 3 on the transparent substrate 1. In an implementation, the transparent substrate 1 may be formed of quartz. The light shielding patterns 3 may include molybdenum (Mo) and silicon (Si). A light transmittance of the light shielding patterns 3 may be substantially zero (0%). Shapes of the light shielding patterns 3 may be varied as desired for realizing semiconductor circuit patterns. The light shielding pattern 3 may include a first surface 3a (adjacent to or contacting the transparent substrate 1), a second surface 3b (spaced apart from the transparent substrate 1), and sidewalls 3s (connected between the first surface 3a and the second surface 3b). An etch stop layer 5 may be disposed on, e.g., at least, the sidewalls 3s of the light shielding pattern 3. In an implementation, the etch stop layer 5 may extend onto the second surface 3b of the light shield pattern 3. The etch stop layer 5 may have an etch rate lower than an etch rate of the light shielding pattern 3, with respect to an ammonia-based cleaning solution. The ammonia-based cleaning solution may include at least one of ammonia water (i.e., ammonium hydroxide $NH_4OH$) or tetramethylammonium hydroxide (TMAH). For example, the ammonia-based cleaning solution may include ammonia water ($NH_4OH$), tetramethylammonium hydroxide (TMAH), or a SC-1 solution (i.e., a mixed solution of ammonia, hydrogen peroxide, and deionized water). The etch stop layer 5 may include molybdenum, silicon, and nitrogen. In this case, a nitrogen content (or a nitrogen concentration) in the etch stop layer 5 may be higher than a nitrogen content (or a nitrogen concentration) in the light shielding pattern 3. The nitrogen content of the etch stop layer 5 may be about 14 at % to about 28 at % of a molybdenum content of the etch stop layer 5. For example, the nitrogen content of the etch stop layer 5 may be about 14 at % to about 28 at %, relative to 100 at % of molybdenum in the etch stop layer 5. The etch stop layer 5 may have a thickness of about 3 nm (nanometers) or less. In an implementation, the etch stop layer 5 may cover at least all of the sidewalls 3s of the light shielding patterns 3.

Figure 3:
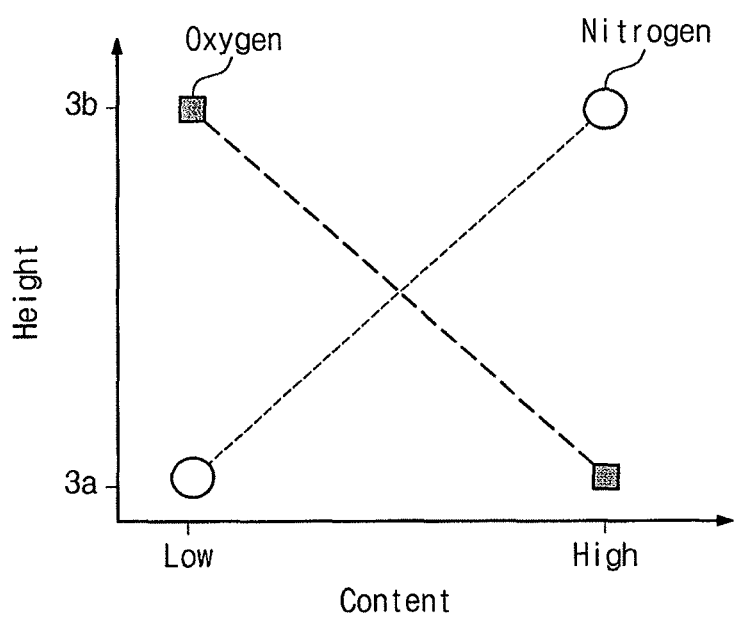
FIG. 3 illustrates a graph showing an oxygen content and a nitrogen content according to a height in a light shielding pattern of FIG. 2.

FIG. 3 illustrates a graph showing an oxygen content and a nitrogen content according to a height in the light shielding pattern of FIG. 2.

Referring to FIGS. 1 to 3, in the present embodiment, the light shielding pattern 3 may be formed of molybdenum-silicon oxynitride (MoSiON). In this case, a nitrogen content of a portion of the light shielding pattern 3 adjacent to the second surface 3b may be higher than a nitrogen content of a portion of the light shielding pattern 3 adjacent to the first surface 3a. For example, the nitrogen content of the light shielding pattern 3 may continuously or discontinuously increase from the first surface 3a to the second surface 3b. On the contrary, an oxygen content (or an oxygen concentration) of the portion of the light shielding pattern 3 adjacent to the second surface 3b may be lower than an oxygen content (or an oxygen concentration) of the portion of the light shielding pattern 3 adjacent to the first surface 3a. For example, the oxygen content of the light shielding pattern 3 may be continuously or discontinuously reduced from the first surface 3a to the second surface 3b. An absorption coefficient of the light shielding pattern 3 with respect to an exposure light may be reduced by concentration gradients (i.e., content gradients) of oxygen and nitrogen in the light shielding pattern 3. Thus, it is possible to prevent the exposure light from being reflected by the light shielding pattern 3 during an exposure process. As a result, formation of a ghost pattern may be reduced and/or prevented.

Additionally, due to the concentration gradients of oxygen and nitrogen, an adhesive strength between the light shielding pattern 3 and the transparent substrate 1 may be improved, and an etching process for formation of the light shielding pattern 3 may be easily performed. The light shielding pattern 3 may have the nitrogen concentration gradient described above. Thus, a thickness T1 of the etch stop layer 5 on the sidewall 3s may be greater than a thickness T2 of the etch stop layer 5 on the second surface 3b. A lattice structure of the etch stop layer 5 may be denser than that of the light shielding pattern 3. The etch stop layer 5 may have the denser lattice structure and the greater nitrogen content than the light shielding pattern 3. Thus, the etch rate of the etch stop layer 5 (by the ammonia-based cleaning solution) may be lowered. For example, the etch rate of the etch stop layer 5 may have be about 10% to about 50% of the etch rate of the light shielding pattern 3 by the ammonia-based cleaning solution.

As a result, even though the photomask 100 may be repeatedly cleaned by the ammonia-based cleaning solution (capable of effectively removing particles after exposure processes are performed using the photomask 100), damage of the light shielding pattern 3 may be prevented by the etch stop layer 5. Thus, a critical dimension (CD) variation of the light shielding pattern 3 may be reduced or minimized.

FIGS. 4 to 8 illustrate cross-sectional views of stages in a method forming a photomask having a cross-sectional view of FIG. 2.

Figure 4:
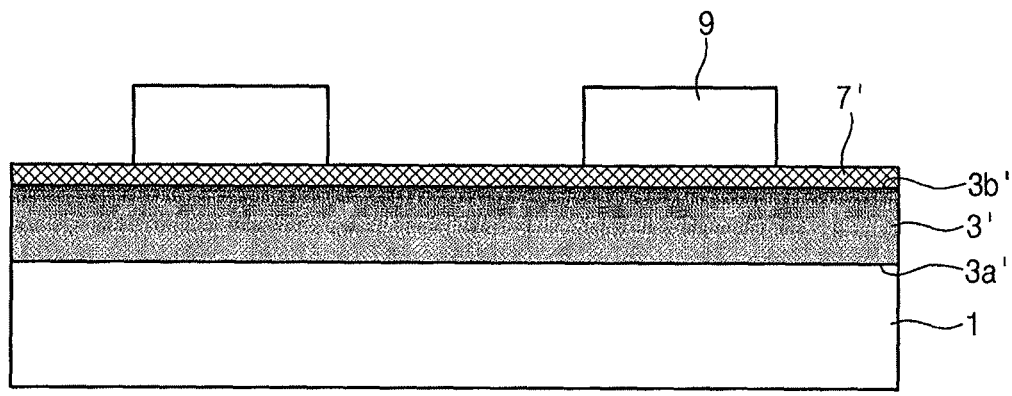
FIGS. 4 to 8 illustrate cross-sectional views of stages in a method forming a photomask having a cross-sectional view of FIG. 2.

Referring to FIG. 4, a light shielding layer 3' may be formed on a transparent substrate 1. The light shielding layer 3' may be formed by, e.g., a direct current (DC) sputtering method, a radio-frequency (RF) sputtering method, a chemical vapor deposition (CVD) method, or an atomic layer deposition (ALD) method. The light shielding layer 3' may have a first surface 3a' adjacent to the transparent substrate 1 and a second surface 3b' spaced apart from the transparent substrate 1. The second surface 3b' may be opposite to the first surface 3a'. Flow rates of source gases may be varied during the formation of the light shielding layer 3', so that the light shielding layer 3' may have the oxygen content and the nitrogen content varied according to a height, e.g., distance from the substrate 1, thereof, as described with reference to FIG. 3. For example, a portion of the light shielding layer 3' adjacent to the first surface 3a' (e.g., proximate to the substrate 1) may have a relatively high oxygen content and a relatively low nitrogen content, and a portion of the light shielding layer 3' adjacent to the second surface 3b' (e.g., distal to the substrate 1) may have a relatively low oxygen content and a relatively high nitrogen content. A hard mask layer 7' may be formed on the light shielding layer 3'. The hard mask layer 7' may be formed of a chromium-based material, e.g., chromium nitride (CrN). The hard mask layer 7' may be formed by a DC sputtering method, a RF sputtering method, a CVD method, or an ALD method. The hard mask layer 7' may have a thickness of about 10 nm or less. Photoresist patterns 9 may be formed on the hard mask layer 7'.

Figure 5:
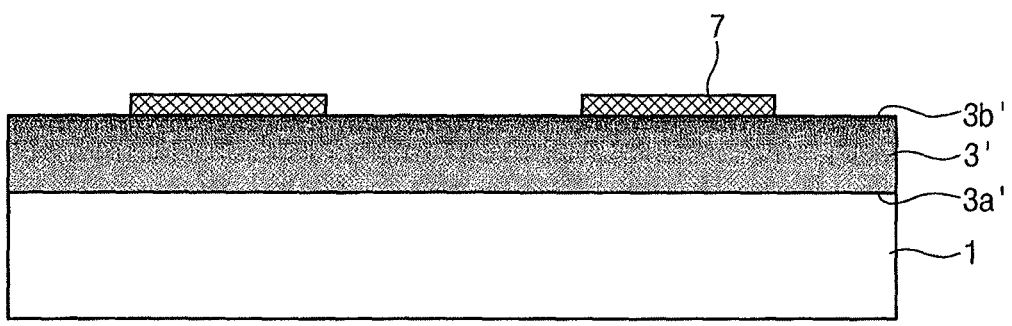

Referring to FIG. 5, the hard mask layer 7' may be etched using the photoresist patterns 9 as etch masks to form hard mask patterns 7. In an implementation, chlorine and oxygen may be used as an etching gas. The photoresist patterns 9 may be damaged by the etching gas. However, the chromium-based hard mask layer 7' may have a relatively thin thickness of, e.g., about 10 nm or less. Thus, the photoresist patterns 9 may be damaged less than it is used for formation of a chromium-based light shielding pattern of a several tens nm (e.g., about 70 nm). Therefore, shapes of the photoresist patterns 9 may be accurately transferred to the hard mask patterns 7. The portion of the light shielding layer 3' adjacent to the second surface 3b may have the high nitrogen concentration. Thus, it may function as an etch stop layer during the formation of the hard mask patterns 7.

Figure 6:
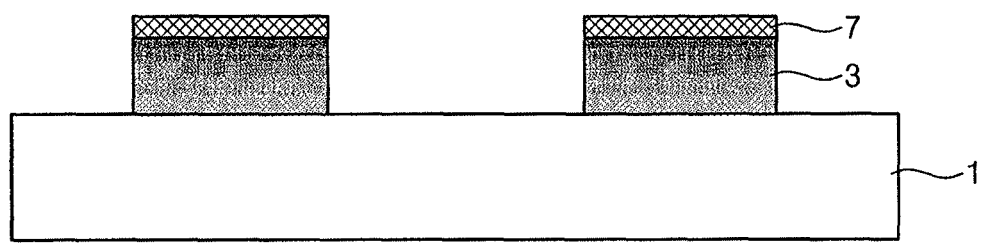
Figure 7:
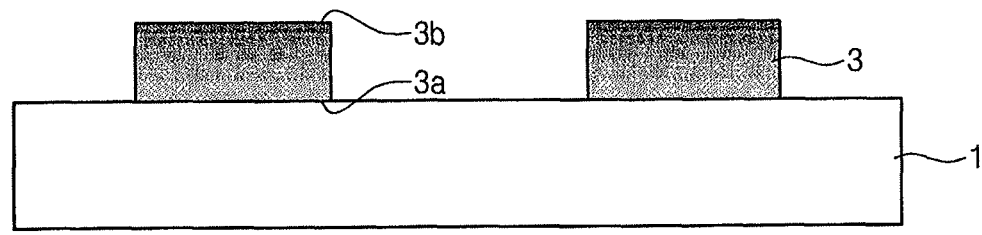

Referring to FIGS. 6 and 7, the light shielding layer 3' may be etched using the hard mask patterns 7 as etch masks to form light shielding patterns 3 and to expose a top surface of the transparent substrate 1 between the light shielding patterns 3. In an implementation, sulfur hexafluoride ($SF_6$) and oxygen may be used as an etching gas for the formation of the light shielding patterns 3. Subsequently, the chromium-based hard mask patterns 7 may be selectively removed using chlorine and oxygen plasma.

Figure 8:
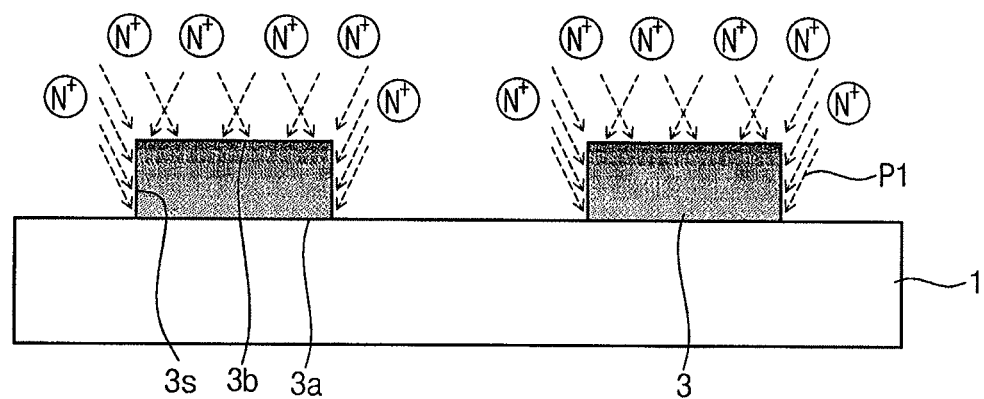

Referring to FIGS. 8 and 2, a plasma nitriding process P1 may be performed on at least sidewalls 3s of the light shielding patterns 3, thereby forming an etch stop layer 5. The plasma nitriding process P1 may be performed using a plasma power of about 1,500 W to about 3,000 W at a temperature of about 25 degrees Celsius to about 300 degrees Celsius under an atmosphere including at least one of nitrogen gas and ammonia gas. The plasma nitriding process P1 may be performed under an atmosphere without oxygen, e.g., an oxygen-free atmosphere. In an implementation, hydrogen may be additionally supplied during the plasma nitriding process. An amount of the supplied hydrogen may be about 4% of a total of the gases used in the plasma nitriding process P1. Nitrogen ions $N^+$ may permeate into at least the sidewall 3s of the light shielding pattern 3 by the plasma nitriding process P1. A permeation depth of the nitrogen ion into the sidewall 3s may be about 3 nm or less. As described above, the nitrogen ions $N^+$ may permeate. Thus, the etch stop layer 5 may be formed to have a nitrogen content higher than that of the light shield pattern 3. The portion of the light shielding pattern 3 adjacent to the second surface 3b may have a nitrogen content that is approximate to a saturation state. Thus, it may be difficult for the nitrogen ions $N^+$ to permeate into the portion of the light shielding pattern 3 adjacent to the second surface 3b. As a result, as may be seen in FIG. 2, the etch stop layer 5 may have the thicknesses T1 and T2 that are different from each other. Even though the nitrogen ions $N^+$ may not permeate into the portion of the light shielding pattern 3 adjacent to the second surface 3b, the nitrogen ions $N^+$ may collide with the second surface 3b, such that an atom lattice structure of the portion of the light shielding pattern 3 adjacent to the second surface 3b may become denser.

Figure 9:
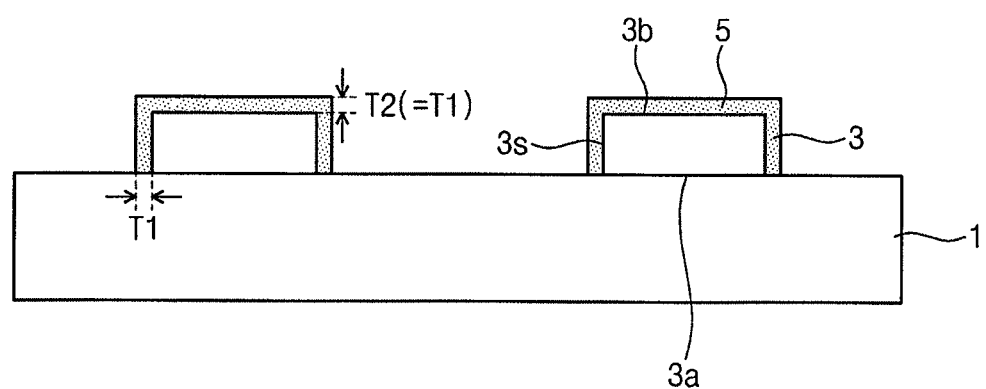
FIG. 9 illustrates a cross-sectional view taken along a line I-I' of FIG. 2 to illustrate a photomask according to a second embodiment.

FIG. 9 illustrates a cross-sectional view taken along a line I-I' of FIG. 2 to illustrate a photomask according to a second embodiment.

Referring to FIG. 9, a light shielding pattern 3 may include at least one of molybdenum silicide (MoSi), molybdenum-silicon nitride (MoSiN), molybdenum-silicon oxide (MoSiO), or molybdenum-silicon oxynitride, in a photomask 101 according to the present embodiment. However, a nitrogen content and/or an oxygen content of the light shielding pattern 3 according to the present embodiment may be substantially uniform, unlike the oxygen content and the nitrogen content of the light shielding pattern 3 in the previous embodiment. In this case, a thickness of the etch stop layer 5 covering the light shielding pattern 3 may be substantially uniform, regardless a position of the etch stop layer 5 (i.e., T1=T2), e.g., regardless of a distance from the substrate 1. Other elements of the photomask 101 may be the same as/similar to the elements corresponding thereto in the previous embodiment of FIG. 2.

First Experiment Example

Height Variation of Light Shielding Pattern According to Existence of Etch Stop Layer First and second samples were manufactured to have light shielding patterns formed of molybdenum-silicon oxide (MoSiO). An etch stop layer was not formed on the light shielding pattern of the first sample, and an etch stop layer was formed on the light shielding pattern of the second sample by a plasma nitriding process described below. The etch stop layer of the second sample was formed of molybdenum-silicon oxynitride (MoSiON). A flow rate of nitrogen was about 2,000 sccm in the plasma nitriding process. The plasma nitriding process was performed using a plasma power of about 2,000 W at a temperature of about 200 degree Celsius. A micro-plasma of about 2.45 GHz was applied in the plasma nitriding process. Thereafter, a cleaning process using ammonia water in an amount about 300 ppm was performed on each of the first and second samples for about 10 minutes. Height variations of the first and second samples are shown in the following Table 1. A height of the first sample was a height of the light shielding pattern, and a height of the second sample was a height (e.g., a thickness) of the etch stop layer (on the light shielding pattern).

TABLE 1

| | Height (Å) before cleaning process | Height (Å) after cleaning process | Etch rate (Å/min) |
|---|---|---|---|
| First sample (light shielding pattern (MoSiO) without etch stop layer | 450 | 356 | 9.4 |
| Second sample (etch stop layer (MoSiON)) | 80 | 38 | 4.2 |

Referring to table 1, the etch rate of the molybdenum-silicon oxynitride (MoSiON) (of the etch stop layer) was 4.2 Å/min, and the etch rate of the molybdenum-silicon oxide (MoSiO) (of the light shielding pattern) was 9.4 Å/min. For example, the etch rate of the molybdenum-silicon oxynitride (MoSiON) was less than a half of the etch rate of the molybdenum-silicon oxide (MoSiO).

Second Experiment Example

In the present experiment example, the plasma nitriding process was performed on the light shielding pattern having the nitrogen content gradient and the oxygen content gradient as described with respect to FIGS. 2 and 3. The structure formed by the second experiment example was analyzed by a transmission electron microscope (TEM) and an energy dispersive x-ray spectrometer (EDAX). The plasma nitriding process was performed using a plasma power of about 2,000 W and nitrogen of a flow rate of about 2,000 sccm at a temperature of about 200 degree Celsius. A micro-plasma of about 2.45 GHz was applied in the plasma nitriding process.

Figure 10:
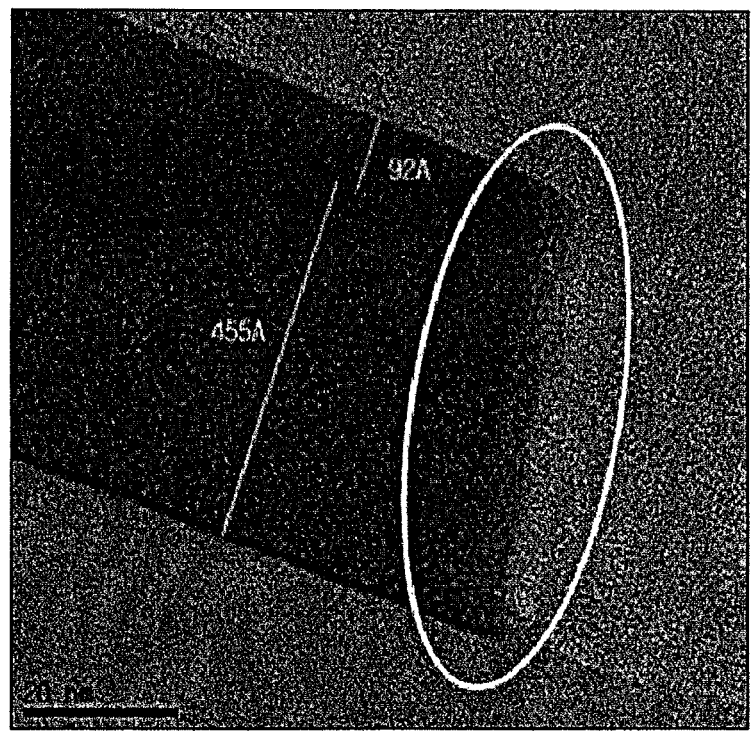
FIG. 10 illustrates a transmission electron microscope (TEM) image of a structure formed as the result of a second experiment example.

FIG. 10 illustrates a transmission electron microscope (TEM) image of a structure formed as the result of a second experiment example. Referring to FIG. 10, a lower portion (a thickness of 455 Å) of the light shielding pattern was formed of molybdenum-silicon oxide (MoSiO), and an upper portion (a thickness of 92 Å) of the light shielding pattern was formed of molybdenum-silicon oxynitride (MoSiON). Additionally, molybdenum-silicon oxynitride (MoSiON) was formed in a sidewall portion (i.e., a portion in an ellipse) of the light shielding pattern by the plasma nitriding process. A thickness of the molybdenum-silicon oxynitride (MoSiON) of the sidewall portion was about 3 nm.

Figure 11A:
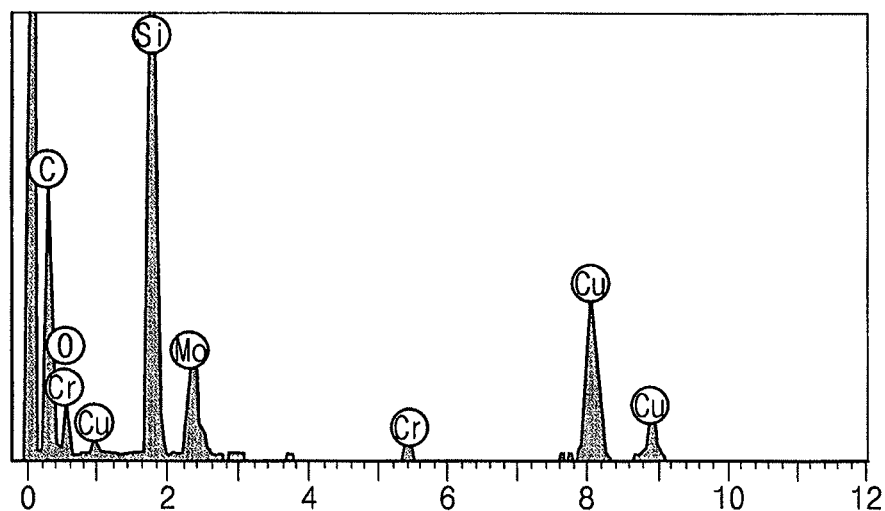
FIGS. 11A, 11B, and 11C illustrate graphs showing the results of an energy dispersive x-ray spectrometer (EDAX)
Figure 11B:
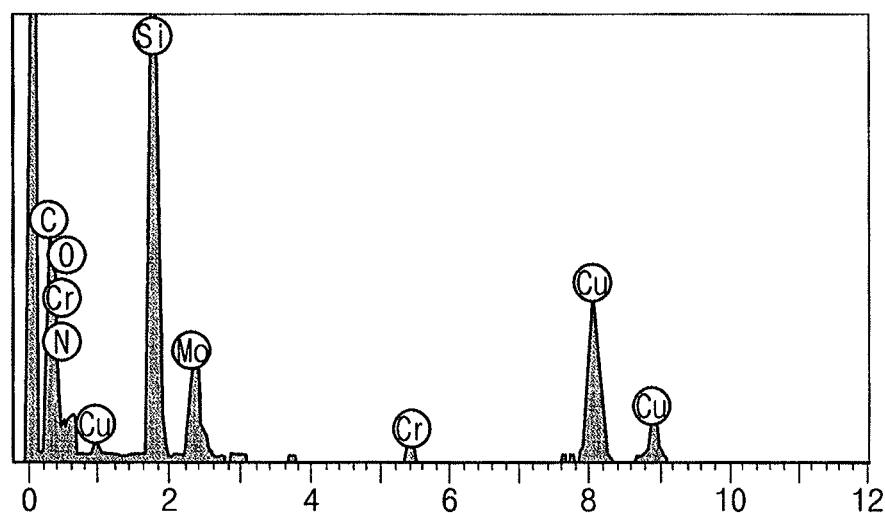
Figure 11C:
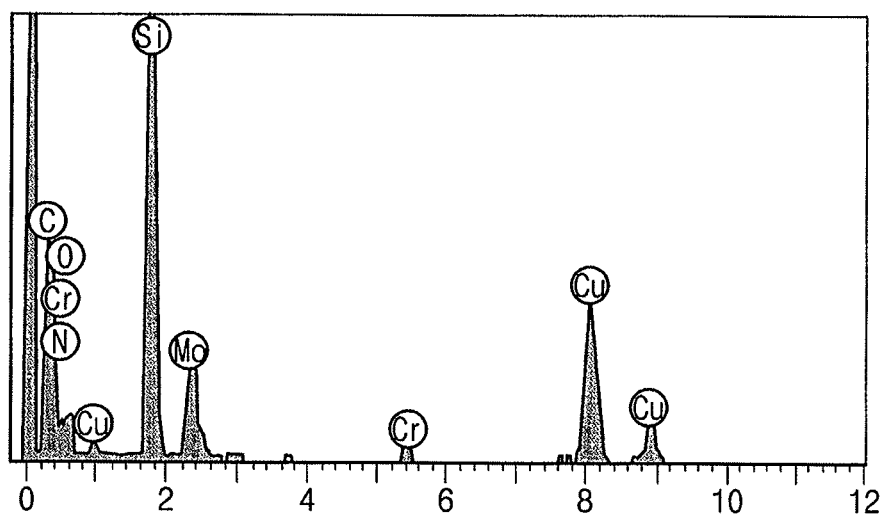

FIGS. 11A, 11B, and 11C illustrate graphs showing the results of an energy dispersive x-ray spectrometer (EDAX) in a lower portion, an upper portion, and a sidewall portion of a light shielding pattern, respectively. Referring to FIGS. 11A to 11C, nitrogen was not detected from the lower portion of the light shielding pattern as illustrated in FIG. 11A. On the contrary, nitrogen was detected from the upper portion and the sidewall portion of the light shielding pattern as illustrated in FIGS. 11B and 11C. Thus, it may be seen that the sidewall portion of the light shield pattern was formed of molybdenum-silicon oxynitride (MoSiON).

By way of summation and review, a fineness technology for interconnection patterns constituting a circuit has been considered, and/or a fineness technology for contact holes connecting layers constituting a cell to each other has been considered. Thus, new technologies capable of finely and accurately forming circuit patterns on photomasks using photolithograph processes for the formation of the interconnection patterns and/or the contact holes may be desirable.

Embodiments provide a photomask capable of reducing or minimizing a size variation of fine patterns.

Embodiments provide a method of forming a photomask capable of reducing or minimizing a size variation of fine patterns.

According to the embodiments, the photomask may include the etch stop layer covering the sidewall of the light shielding pattern. Due to the etch stop layer, the light shielding pattern may not be damaged during the cleaning process using the ammonia-based cleaning solution. Thus, the CD variation of the light shielding pattern may be minimized.

Additionally, the light shielding pattern of the photomask may have the oxygen concentration gradient and the nitrogen concentration gradient according to the height (e.g., from the substrate). Thus, the amount of the exposure light reflected by the surface of the light shielding pattern may be minimized, such that an undesirable ghost pattern may be reduced and/or prevented.

In addition, the light shielding pattern of molybdenum silicide may be formed using the relatively thin chromium-based hard mask, such that accurate fine patterns may be easily formed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming a photomask, the method comprising:
    forming a light shielding pattern on a transparent substrate such that the light shielding pattern include molybdenum and silicon; and
    performing a plasma nitriding process on at least a sidewall of the light shielding pattern to form an etch stop layer.

2. The method as claimed in claim 1, wherein the plasma nitriding process is performed using a plasma power of about 1,500 W to about 3,000 W at a temperature of about 25 degrees Celsius to about 300 degrees Celsius under an atmosphere including at least one of a nitrogen gas and an ammonia gas.

3. The method as claimed in claim 1, wherein nitrogen ions permeate into at least the sidewall of the light shielding pattern by the plasma nitriding process.

4. The method as claimed in claim 1, wherein forming the light shielding pattern includes:
    forming a light shielding layer on the transparent substrate;
    forming a hard mask pattern on the light shielding layer; and
    patterning the light shielding layer using the hard mask pattern as an etch mask.

5. The method as claimed in claim 4, wherein the hard mask pattern contains chromium.

6. The method as claimed in claim 5, wherein the hard mask pattern has a thickness of about 10 nm or less.

7. The method as claimed in claim 4, wherein the light shielding layer is formed to have a nitrogen concentration gradient according to a height.

8. The method as claimed in claim 1, further comprising cleaning the light shielding pattern using an ammonia-based cleaning solution, wherein the etch stop layer has an etch rate lower than an etch rate of the light shielding pattern with respect to the ammonia-based cleaning solution.

9. The method as claimed in claim 1, wherein the plasma nitriding process is performed under an oxygen-free atmosphere.

* * * * *